(12) United States Patent
Simmons

(10) Patent No.: US 9,310,402 B2
(45) Date of Patent: Apr. 12, 2016

(54) SYSTEMS AND METHODS FOR AUTOMATED ELECTRICITY DELIVERY MANAGEMENT FOR OUT-OF-CONTROL-AREA RESOURCES

(71) Applicant: GRIDSPEAK CORPORATION, Oakland, CA (US)

(72) Inventor: Karl A. Simmons, Oakland, CA (US)

(73) Assignee: GRIDSPEAK CORPORATION, Oakland, CA (US)

( * ) Notice: Subject to any disclaimer, the term of this patent is extended or adjusted under 35 U.S.C. 154(b) by 0 days.

(21) Appl. No.: 14/272,413

(22) Filed: May 7, 2014

(65) Prior Publication Data

US 2014/0330532 A1    Nov. 6, 2014

Related U.S. Application Data

(63) Continuation of application No. PCT/US2012/063965, filed on Nov. 7, 2012.

(60) Provisional application No. 61/556,768, filed on Nov. 7, 2011.

(51) Int. Cl.
*G06Q 10/06* (2012.01)
*G06Q 50/06* (2012.01)
*G01R 29/00* (2006.01)
*G06F 17/40* (2006.01)
*G06F 19/00* (2011.01)
*G01R 21/00* (2006.01)
*G06Q 30/08* (2012.01)

(52) U.S. Cl.
CPC .............. *G01R 21/00* (2013.01); *G06Q 10/06* (2013.01); *G06Q 30/08* (2013.01); *G06Q 50/06* (2013.01); *G01R 29/00* (2013.01); *G06F 17/40* (2013.01); *G06F 19/00* (2013.01)

(58) Field of Classification Search
None
See application file for complete search history.

(56) References Cited

U.S. PATENT DOCUMENTS 7,120,520 B2 * 10/2006 Seto .................... B60L 11/1824
307/18
2001/0005802 A1 *  6/2001 Arita ...................... G06Q 50/06
700/286

(Continued)

FOREIGN PATENT DOCUMENTS

| JP | 2001/243358 A | 9/2001 |
|----|---------------|--------|
| JP | 2002/056225 A | 2/2002 |

(Continued)

OTHER PUBLICATIONS

International search report and written opinion dated Mar. 25, 2013 for PCT/US2012/063965.

(Continued)

*Primary Examiner* — Edward Cosimano
(74) *Attorney, Agent, or Firm* — Wilson Sonsini Goodrich & Rosati

(57) ABSTRACT

Systems and methods are provided for automated electricity delivery management. More specifically, the invention relates to systems and methods for instantly and electronically determining available electricity, predicting short-term delivery forecasts, evaluating transmission availability, capacity and paths, determining inter-tie availability, capacity and price, and bidding the power into the market. Such systems and methods may occur on a mobile device, and/or web interface.

20 Claims, 4 Drawing Sheets

(56) References Cited

U.S. PATENT DOCUMENTS

| | | | |
|---|---|---|---|
| 2002/0060497 A1* | 5/2002 | Arita | G06Q 50/06 307/42 |
| 2002/0128749 A1* | 9/2002 | Arita | G06Q 50/06 700/286 |
| 2003/0041002 A1 | 2/2003 | Hao et al. | |
| 2004/0199478 A1* | 10/2004 | Arita | G06Q 50/06 705/412 |
| 2004/0249516 A1* | 12/2004 | Seto | B60L 11/1824 700/295 |
| 2011/0056224 A1 | 3/2011 | Seem | |

FOREIGN PATENT DOCUMENTS

| | | |
|---|---|---|
| JP | 2003/323559 A | 11/2003 |
| JP | 2005/157692 A | 6/2005 |

OTHER PUBLICATIONS

Pederson. Standard Capacity Protocol powerpoint. Dec. 3, 2009.
Rahimi, et al. Convergence Bidding Fundamentals. CAISO Department of Market and Product Development. Jun. 13, 2006.
Tezak. Resource adequecy—alphabet soup! Stanford Washington Research Group. Jun. 24, 2005.

* cited by examiner

US 9,310,402 B2

SYSTEMS AND METHODS FOR AUTOMATED ELECTRICITY DELIVERY MANAGEMENT FOR OUT-OF-CONTROL-AREA RESOURCES

CROSS-REFERENCE

This application is a continuation application of PCT Application No. PCT/US2012/063965, filed Nov. 7, 2011, which claims priority to U.S. Patent Application No. 61/556,768, filed Nov. 7, 2011, each of which is entirely incorporated here by reference.

BACKGROUND OF THE INVENTION

Wholesale electricity market traders buy and sell power from all geographical areas. At times the geographical areas where power is bought and sold are outside the market control area and must be imported. Also at times a power trader may not know the total amount of power that can be imported from a particular resource. This issue often results in non-delivery of power due to lack of real-time generation information, transmission availability and market and business constraints.

Therefore, a need exists for improved systems and methods for automated electricity delivery management for out-of-control-area generation resources.

SUMMARY OF THE INVENTION

The invention relates to systems and methods for instantly and electronically determining available electricity, predicting short-term delivery forecasts, evaluating transmission availability, capacity and paths, determining inter-tie availability, capacity and price, and bidding the power into the market. More specifically, the invention relates to systems and methods for instantly and electronically determining available electricity, predicting short-term delivery forecasts, evaluating transmission availability, capacity and paths, determining inter-tie availability, capacity and price, and bidding the power into the market on a mobile device, or web interface.

An aspect of the invention may be directed to an automated electricity delivery management system comprising: one or more servers for receiving information from an entity outside a control area and from an entity within the control area; and a processor for determining in real-time, based on the information received from the entity outside the control area and the information received from the entity within the control area, the distribution of electricity from the entity outside the control area to the entity within the control area.

Another aspect of the invention provides a method for automated electricity delivery management. The method may comprise: receiving information about real-time out-of-control area power generation from an out-of-control area power generator using a processor determining available transmission paths; communicating at least one transmission reservation to a transmission owner capable of transmitting the electricity generated by the out-of-control area power generator; and determining, using a processor, electricity delivery inside the control area using inter-tie bidding. Such determination may also be based on the received real-time out-of-control area power generation information.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

DETAILED DESCRIPTION OF THE INVENTION

While preferred embodiments of the invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention.

The invention provides systems and methods for automated electricity delivery management systems and methods in accordance with aspects of the invention. Various aspects of the invention described herein may be applied to any of the particular applications set forth below or for any other types of power management system. The invention may be applied as a standalone system or method, or as part of a service, tool, or electricity management package. It shall be understood that different aspects of the invention can be appreciated individually, collectively, or in combination with each other.

Figure 1:
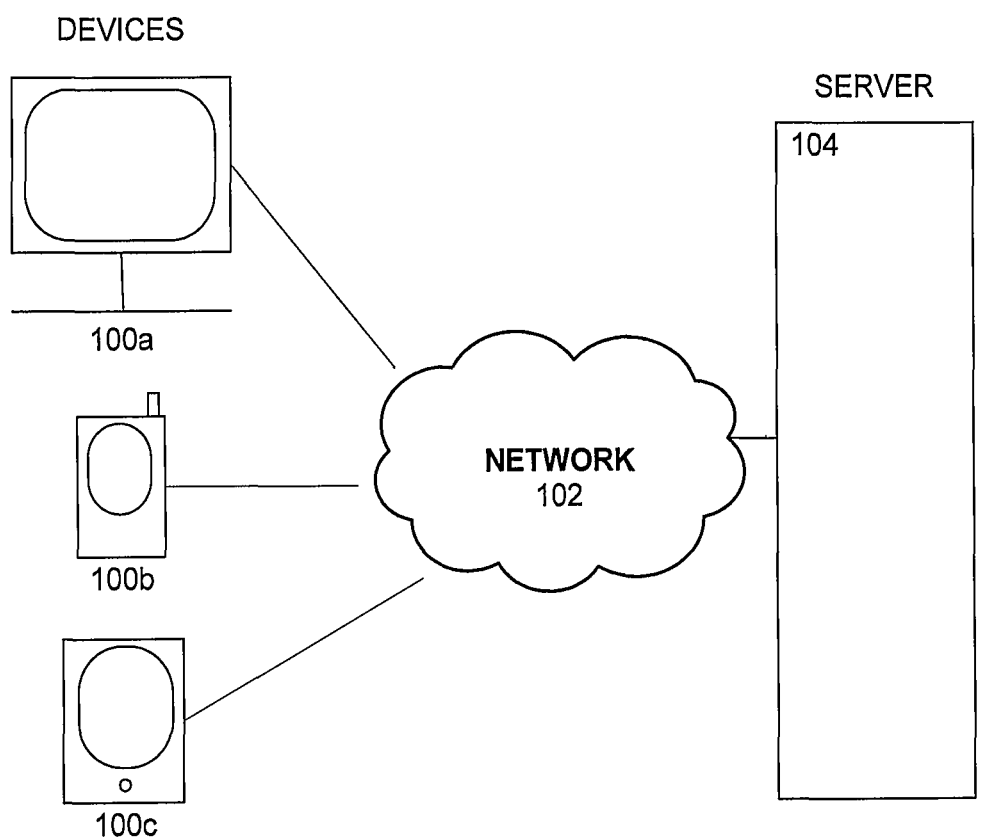
FIG. 1 shows a plurality of devices capable of communicating with a server over a network.

FIG. 1 shows a plurality of devices 100a, 100b, 100c capable of communicating with a server 104 over a network 102. In some embodiments, the server may be owned and/or run by a system operator. In some instances, the server may be owned and/or run by a third party that may communicate with one or more system operator and/or any other entities described elsewhere herein. Alternatively, the server may be owned and/or run by any entity described herein. The server may be part of an automated electricity delivery management system. The server may facilitate interactions with users of the system and/or may aid in the automated electricity delivery management.

The devices may belong to entities interacting with the system operator, third party and/or any other entities described elsewhere herein. For example, the devices may belong to one or more generator owner, transmission owner, grid operator, electricity distributor, electricity trader, or electricity consumer. One or more of the devices interacting with the server may belong to the system operator or third party.

The devices 100a, 100b, 100c may be network devices. Network devices may include computers whether they be a personal computer, server computer, or laptop computer; mobile devices, such as a tablet, personal digital assistants (PDAs) such as a Palm-based device or Windows CE device; phones such as cellular phones, smartphones (e.g., iPhone, BlackBerry, Android, Treo); a wireless device such as a wireless email device or other device capable of communicating wirelessly with a computer network or other communication network; or any other type of network device that may communicate over a network and handle electronic transactions. One or more of the devices may be handheld devices. Any discussion herein of computers or mobile devices may also be applied to any other network devices as provided.

The devices may be the same type of device and/or may include different types of devices. For example, the devices may be a computer 100a, a smartphone 100b, and/or a tablet 100c. Mobile devices may interact with the system.

The devices 100a, 100b, 100c may communicate with a web server 104. The communication between a network device and a web server may be, for example, a connection between a client computer and a website server over a network 102. One or more servers may communicate with one or more computers or other network devices across a network. For example, a plurality of devices may communicate with a single server, or with a plurality of servers. The network, for example, can include a private network, such as a LAN, or interconnections to the online organizations over a communications network, such as the Internet or World Wide Web or any other network that is capable of communicating digital data, such as a wireless, cellular, or telecommunications network. Each computer or other network device may connect to one or more web server over the network using data protocols, such as HTTP, HTTPS and the like. In one example, a workflow engine may reside on a computer separate from a web/application server that is on the same LAN as the web/application server.

A user, such as a generator owner, transmission owner, grid operator, investor-owned utility (IOU), electricity traders, customer of the system, or any other party, or employee, affiliate, or associate thereof, may interact with a server, computer, mobile device (e.g., tablet, smartphone) or other network device that may be part of an electricity delivery system. When a computer or other network device is communicating with the web server, the device may have a processor and a memory that may store an operating system (OS) and a browser application or other application to facilitate communications with the web server. For example, the operating system may operate to display a graphical user interface to the user and permit the user to execute other computer programs, such as the browser application. The browser application, such as Microsoft Internet Explorer, Mozilla Firefox, when executed by the processor, permits the user to access the World Wide Web as is well known. Similarly, other applications or "apps" on mobile devices may be used. A server, computer, or other network device that may host the workflow designer may have a display which displays a graphical user interface. Any display known in the art may be used including, but not limited to, a cathode ray tube, a liquid crystal display, a plasma screen, a touchscreen, an LED screen, or an OLED display.

The devices and/or server may include one or more processor and/or memory. The processor may be capable of executing one or more step of the automate electricity delivery management system. One or more steps may occur as dictated by one or more set of rules. The rules may dictate when a user performs one or more steps, or when a machine automatically performs one or more steps. The rules may permit automated electricity delivery management based on a set of one or more conditions. The processor may permit the automated management of electricity delivery without requiring human intervention at one or more steps. The devices and/or server may have memory that may include non-transitory and/or tangible computer readable media which may contain instructions, logic, data, or code that may be stored in persistent or temporary memory of the computer or other device, or may somehow affect or initiate action by the computer or other device. The memory may include one or more databases.

Figure 2:
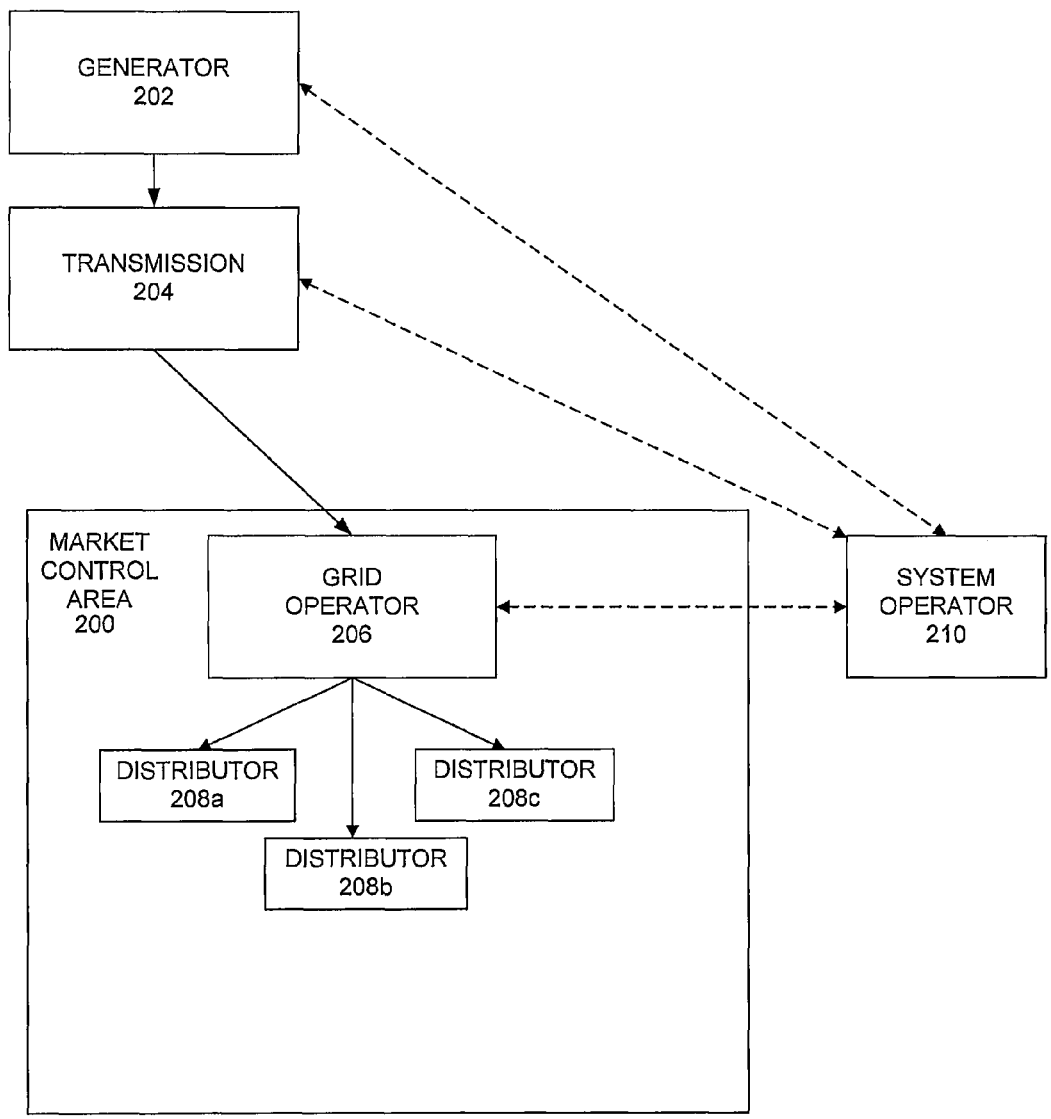
FIG. 2 illustrates one or more entities that may be in communication with one another in an automated electricity delivery management system in accordance with an embodiment of the invention.

FIG. 2 illustrates one or more entities that may be in communication with one another in an automated electricity delivery management system in accordance with an embodiment of the invention.

In some embodiments, a control area 200 may be provided. The control area may be incorporated as part of the automated electricity delivery system. The control area may be a geographic area which may regulate its generation in order to balance load and maintain planned interchange schedules with other control areas. The control area may be defined by a geofence, which may include a virtual perimeter for a real-world geographic area. In some instances, the control area may be a portion of the grid over which a single entity may have responsibility for maintaining the balance of supply and demand. In some embodiments, an entity having responsibility for maintaining the balance within a control area may contract out necessary services that may assist with maintaining grid reliability. In some instances, a group or consortium of entities may have responsibility for maintaining the balance of supply and demand within a control area.

A control area may receive power from power generators that are within the control area. In some instances, the control area may receive power from power generators that are outside the control area. The control area may receive power from any combination of power generators that may be within or outside the control area. In one example, an out-of-control area generator 202 may provide electricity to a market control area 200 via one or more transmission infrastructure 204. In some instances, it may be preferable for power to be received from within-control area generators, but circumstances may dictate situations where power is received from out-of-control area generators.

Examples of transmission infrastructure 204 may include transmission lines and/or towers. In some examples, power lines may be 765, 500, 345, 230, and/or 138 kV lines. In some embodiments, a generating step up transformer may be used to transfer the generated electricity to the transmission lines, and a substation step down transformer may be used to transfer the electricity from the transmission lines to a grid operator 206. Transmission infrastructure may include a physical electrical transport member. Transmission infrastructure may be tangible and/or non-transitory.

The electricity may be provided to one or more grid operator 206 within the control area 200. The grid operator may be physically located within the control area or may interact with distributors physically within the control area or distributing electricity to the control area. In some embodiments, a single grid operator, or a plurality of grid operators may operate within a control area. A grid operator may be an electricity distribution operator, and may assist with distributing the electricity to one or more electricity distributors 208a, 208b, 208c such as investor-owned utilities (IOUs), power marketers, or electricity service providers of any kind. Examples of electricity distributors include but are not limited to wholesale purchasers and retail sellers of electricity. Electricity may flow from the generator 202, through the transmission infrastructure 204, to one or more grid operator, allowing distribution by a distributor. One or more intermediary parties may be involved in the electricity distribution. For example, one or more intermediary party may receive electricity through the transmission infrastructure from the power generator, and may distribute the electricity to one or more grid operators. In another example, one or more intermediary parties may receive electricity from one or more grid operators and may distribute the electricity to one or more electricity distributors.

The grid operator may operate as a device/server or through a device/server as described elsewhere herein. One or more step performed by a grid operator may be through aid of a processor. One or more step may be automated without requiring human intervention.

A system operator 210 may be in communication with one or more of the other entities of the electricity distribution system. The system operator may be within the control area or may be external to the control area. The system operator may permit communications with one or more party within the control area to one or more parties outside the control area. The system operator may manage or assist with managing the security of the power system in real time and may coordinate the supply and demand for electricity. The system operator may assist with managing the electricity distribution within a control area or within a plurality of control areas. In some instances, the system operator may maintain a continuous balance between the electricity supplied from the power generators, and demand from consumers. The system operator may determine an optimal or preferable combination of power generators and reserve providers for a market trading period. Any description herein of the system operator and/or tasks performed by the system operator may be applied to any other third party that may be utilized by the system operator to assist with any tasks of the system operator. For example, a third party may be in communication with the system operator and/or any of the entities described herein and may have any of the characteristics or components, or may perform any of the steps relating to the automated electricity delivery management to the control area and possibly within the control area, described elsewhere herein.

The system operator may operate as a device/server or through a device/server as described elsewhere herein. One or more steps performed by a system operator may be through aid of a processor. One or more steps may be automated without requiring human intervention.

In some instances, a system operator may be in communication with a power generator owner 202, transmission owner 204, and/or grid operator 206. The power generator owner and/or transmission owner may be within the same control area as the grid operator, or may be outside the grid operator's control area. The system operator may be in continuous and/or periodic communications with one or more of the entities. For example, the system operator may receive and/or send continuous information in real-time. Alternatively, the system operator may receive and/or send information on a periodic basis at set or predetermined intervals, which may or may not be regular intervals of time. The system operator may receive and/or send information in response to a request or event. Such communications may occur automatically without requiring human intervention.

In some embodiments, the system operator may receive information from an out-of-control area generator owner and/or transmission owner. Such information may include real-time generation information, transmission availability and/or related market and business constraints. Real-time generation information may include the generator power capacity, any scheduled outages, how much generator availability is currently freed-up, or if any unforeseen circumstances occur (generators unexpected free up providing more generation availability, or generators fail or experience unscheduled outages which reduces generation availability). Real-time generation information may include pricing information, which may remain steady or may vary in real-time. Real-time transmission availability may include electricity delivery capacity (e.g., quantity) and/or path. A system operator may also receive real-time inter-tie availability. Electricity transmission pricing information may also be provided, which may remain steady or may vary in real-time. Such out-of-control area information may be made available to the system operator which may use the information to assist with electricity distribution as needed within the control area. The system operator may facilitate electricity distribution from an out-of-control area generator to a within-control area grid operator. Real-time information may be updated within seconds or milliseconds.

The system operator may be capable of one-way and/or two-way communications with each of the entities. For example, the system operator may receive real-time information from the generator owner, such as generator availability and/or pricing. The system may also be able to inform the generator of power that one or more grid operator may wish to receive. The system may receive real-time transmission availability information and/or pricing information from the transmission owner. The system may also inform the transmission owner of transmission reservations. The system may operator may communicate within one or more grid operator within a control area. The system may receive information about electricity demand from consumers (e.g., through distributors, and/or information about electricity demand from distributors) and/or may provide electricity availability and/or pricing information to the grid operator. In some instances, the system may communicate with one or more intermediary parties that may communicate with the grid operators, or may communicate with the grid operators directly. The system may communicate with one or more electricity trader and/or any other entity that may be involved in buying and/or selling electricity.

The system operator may be capable of performing one or more of the steps automatically without human interaction. The system operator may collect any of the information described herein, in real-time and/or at pre-set intervals. The system operator may collect the information automatically without human interaction. Such communications may occur over a network, such as those described elsewhere herein. Such communications may occur wirelessly. Such communications may be initiated by a processor of one or more server and/or device described elsewhere herein.

Figure 3:
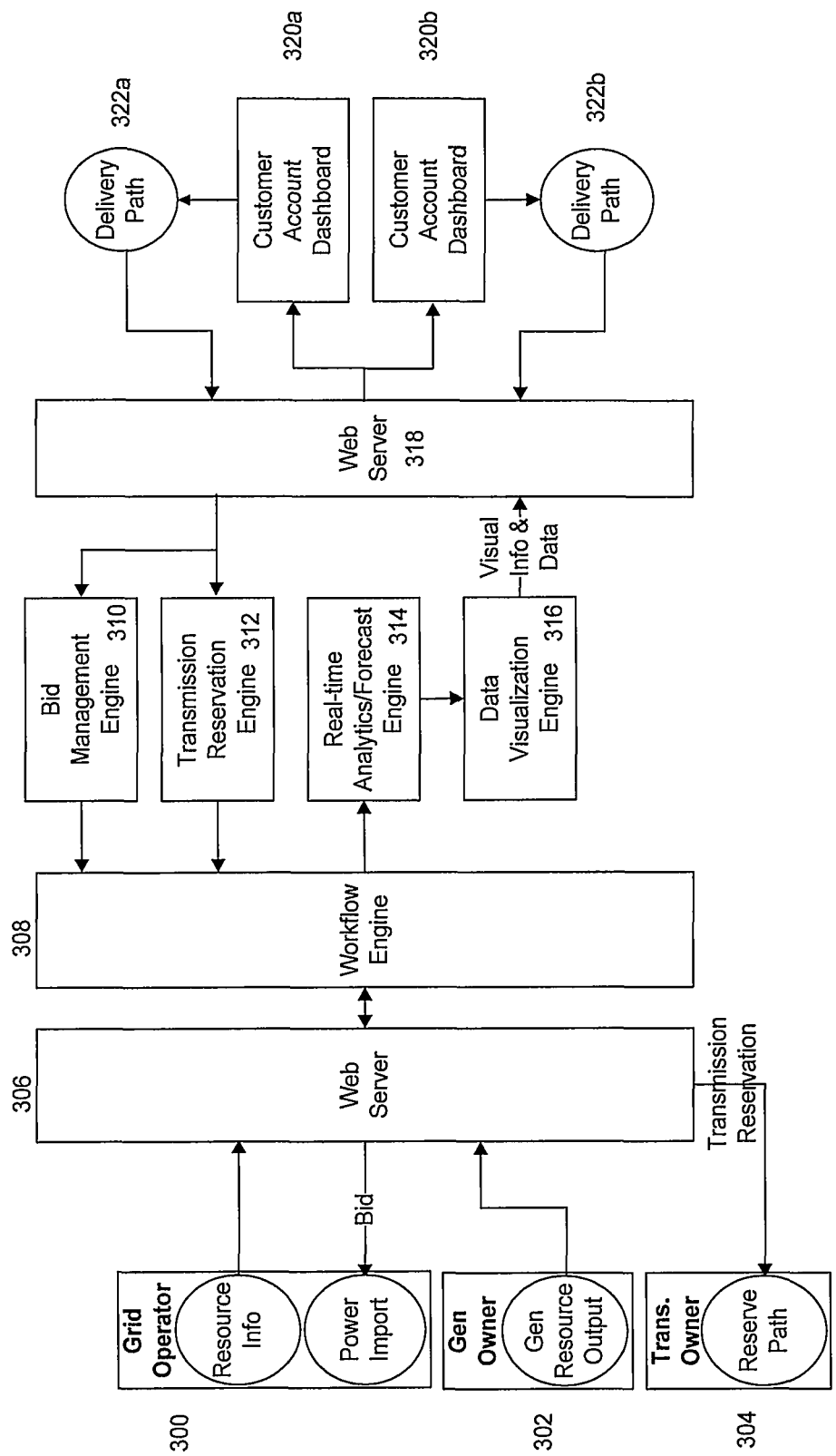
FIG. 3 shows an automated electricity delivery management system in accordance with an embodiment of the invention.

FIG. 3 shows an automated electricity delivery management system in accordance with an embodiment of the invention.

One or more entity may communicate with a web server 306. The web server may be part of an automated electricity delivery management system. Examples of entities that may communicate with the web server may include a grid operator 300, generator owner 302, and transmission owner 304. Additional entities may communicate with the web server including but not limited to distributors, electricity traders and/or consumers. Single or multiple of the same types of entities may communicate with the web server. Entities may communicate with the web server using one or more network device. The network device may be a computer, mobile device, or any other type of device. The network device may communicate with the web server over a network. A graphical user interface may be displayed on the network device that may facilitate a user's communication with the web server.

In some instances, information may be communicated directly between the entities and the web server without need for human interference. For example, one or more sensor may be provided at a generator, which may indicate whether the generator is being used and/or what capacity of electricity is being generated. In another example, one or more sensor may be provided at a transmission line which may determine whether electricity is being transmitted and/or capacity for electricity to be transmitted. In an additional example, one or more device of a grid operator may generate an automated request and/or send information about electricity need at a point in time.

A grid operator 300 may be capable of two-way communication with the web server 306. For example, the grid operator may send resource information to the web server. The grid operator may also receive power import information from the web server. One or more bid may be provide by or to the grid operator. Such information may be provided and/or received in real-time.

A generator owner 302 may communicate with the web server 306. Such communications may include one-way and/or two-way communications. The generator owner may send generation resource output information to the web server. The generator owner may be in an area outside the control area receiving the electricity. The generator owner may optionally send other information, such as pricing information, to the web server. The generator owner may receive information from the web server, such as purchase requests for the generator's electricity.

A transmission owner 304 may communicate with the web server 306. Such communications may include one-way and/or two-way communications. The transmission owner may receive transmission reservation requests from the web server. The transmission owner may be in an area outside the control area receiving the electricity. The transmission owner may be capable of transmitting power from generator that is outside the control area receiving the electricity. The transmission owner may optionally send information, such as transmission availability information (e.g., capacity and/or path), or pricing information, to the web server.

The same server may be used to communicate with the plurality of entities or different servers may be utilized, that may be capable of communicating with one another. Any description herein of a server may apply to a single server or a plurality of networked servers.

The server 306 may be in communication with one or more workflow engine 308 and/or may utilize a workflow engine. The workflow engine may perform one or more step that may automatically determine the electricity distribution within the system. The workflow engine may utilize the information collected from one or more entity. The workflow engine may include information collected from the grid operator, generator owner, and/or transmission owner. The workflow engine may receive the information provided in real-time, and perform real-time analyses. The workflow engine may operate with aid of a processor. The workflow engine may operate with the use of one or more server. The workflow engine may use different or the same server(s) as the web server.

The workflow engine 308 may automatically and electronically determine available electricity; predict short-term delivery forecasts; evaluate transmission availability, capacity and paths; determine inter-tie availability, capacity and paths; and evaluate bids for providing power from out-of-control areas into the control area.

The workflow engine 308 may be in communication with a bid management engine 310, transmission reservation engine 312, and/or real-time analytics/forecast engine 314. In some embodiments, the bid management engine and the transmission reservation engine may provide information to the workflow engine.

For example, the bid management engine may include financial and/or pricing information. For example, bids and/or pricing information provided by the grid operator, generator owner, transmission owner, and/or electricity traders may be provided. One or more of the entities may provide a resource (e.g., generated power, infrastructure to transmit power) and may submit a price. One or more of the entities may have a need for the resource and may receive the pricing information, and may have desired pricing constraints, or may want to minimize or reduce price for the resource. In some instances, the bid management engine may generate bids for any of the entities involved (e.g., offers for selling electricity, selling transmission services, purchasing electricity and/or transmission services) or may manage the bids provided from the entities. The bid management engine may or may not provide suggested bids to the entities. The workflow engine may receive the bidding data and may be able to determine and/or select a bid from the generator owners.

In another example, the transmission reservation engine may include information about the transmission infrastructure. The transmission reservation engine may track different transmission entities, and may include information about availability, capacity and/or pricing. Such information may include information collected from one or multiple transmission entities. The workflow engine may receive the transmission data and may be able to determine and/or select a transmission infrastructure to transmit the electricity from one or more selected generator. The workflow engine may take the transmission data into account when selecting one or more generator, or may transmit the transmission data to be considered for the selection of one or more generator.

The workflow engine may take some or all of the collected into account for determining electricity need for one or more electricity distributor, such as one or more grid operators. The workflow engine may take into account quantity of electricity needed, availability of generators and/or transmission infrastructure, and associated pricing information. The workflow engine may perform such calculations in real-time based on real-time demand for electricity. The workflow engine may be working to meet the demands of a current load.

The workflow engine may also be able to perform such calculations ahead of time. The workflow engine may receive information from the grid operators about predicted energy generation (which may include intermittent resources). In some instances, the workflow engine may be receiving information about real-time generator and/or transmission availability and/or pricing, or predicted generator and/or transmission availability and/or pricing. The workflow engine may be working on the day-ahead system to meet the demands of a forecasted load. The workflow engine may be operating on a short-term forecast, which may be less than or equal to one week in advance, one day in advance, 12 hours in advance, 8 hours in advance, 6 hours in advance, 4 hours in advance, 3 hours in advance, 2 hours in advance, 1 hour in advance, thirty minutes in advance, fifteen minutes in advance, or 10 minutes in advance.

The workflow engine may communicate with a real-time analytics/forecast engine. The real-time analytics and/or forecast engine may perform one or more calculation or step that may connect the entities that need electricity with those that can provide electricity. The real-time analytics and/or forecast engine may perform the calculations or analyses for the workflow engine. The real-time analytics and/or forecast engine may select the optimal or beneficial bids. The real-time analytics and/or forecast engine may utilize one or more algorithms and may determine or provide suggestions for an automated electricity distribution. The real-time analytics and/or forecast engine may utilize information collected by the workflow engine. The real-time analytics and/or forecast engine may be utilized for electricity transactions that are occurring in real-time (e.g., fulfilling a real-time need within a control area), or that are projected to occur in the future (e.g., lining up generators or future generation that may be used to fulfill a forecasted need at a point in time in the future), or any combination thereof.

A data visualization engine 316 may be in communication with the analytics/forecast engine 314. The analytics/forecast engine may provide information to the data visualization engine, which may put the data into a visual form. For example, the data visualization engine may be used to generate tables, charts, graphs, or any other form of data. Such forms of data may show trending over time, or in relation to other factors.

One or more customer account dashboard 320a, 320b may be provided in accordance with an embodiment of the invention. One or more user may interact with a customer account dashboard. A user may be part of an entity, such as a grid operator, generator owner, transmission owner, electricity distributor, electricity trader, consumer, or any other entity that may be involved in the electricity distribution process. A customer may be a primary customer and/or a secondary customer. An example of a primary customer may include a investor-owned utility directly interacting with the system, and/or purchasing electricity. An example of a secondary customer may be an electricity trader that buys and sells electricity in the wholesale electricity market. A customer account dashboard may provide a user interface for the users with the automated wholesale electricity delivery system.

In some instances, a customer may be able to access the customer account dashboard, and interface with an automated electricity distribution system on a mobile network device. The customer may be able to interact with the system via a handheld device. The customer may be able to interact with the system while being in transit.

The customer may utilize a network device that may capable of communicating with the web server 318. The customer account dashboard 320a, 320b may be displayed on the network device. The network device may be a computer or a mobile device, such as a smartphone or tablet, or any other network device described elsewhere herein. The customer dashboard may be displayed on a display interface of the device. A graphical user interface may be provided on the device. The graphical user interface may be provided via a browser, local application or software, or any other technique described elsewhere herein. One customer or a plurality of customers may be capable of accessing the customer account dashboard via a single network device or a plurality of network devices.

The network device may communicate with the web server over a network. A delivery path 322a, 322b may be provided between the customer account dashboard and the web server. A delivery path may be over the internet. Some examples of delivery paths may include email, a wireless mobile device, voice response, or browser (via the Internet).

The web server 318 communicating with the customer account dashboard may or may not be the same web server 306 that may communicate with the various entities.

The data visualization engine 316 may be in communication with the web server 318. Information may be displayed on the customers' devices based on data generated by the data visualization engine. For example, the customer devices may display a table, chart, graph, or any other form of data. Such information may be visually depicted over time or any other factor. Such information displayed may be specific to the customer viewing the information. Such information may also include pricing information and/or electricity delivery information over time, by the source of the electricity, by the transmission of the electricity, by the recipient of the electricity, and/or by any other factor. Such information may include real-time information and/or may also include workflow task items for approval. Such information may also include forecasted information.

The customer may also provide information which may be provided to the web server 318. For example, such information may include information on electricity availability, transmission availability, capacity and/or paths, inter-tie availability, capacity and/or paths, and/or bidding/pricing information. Such information may be provided to the bid management engine 310 and/or the transmission reservation engine 312. Such information may be transmitted to the workflow engine 308. The workflow engine may receive information from a web server 306 that was collected from entities, such as the grid operator 300, generator owner 302, and/or transmission owner 304. The workflow may receive the combined information and perform one or more processing and/or analysis step. Data from the workflow engine may be provided to a real-time analytics/forecast engine 314 which may perform one or more calculation and/or analysis step. The data may be sent to a data visualization engine 316 which may create visual information and data which may be sent to the web server 318, which may send the information to be displayed on the customer's device.

Figure 4:
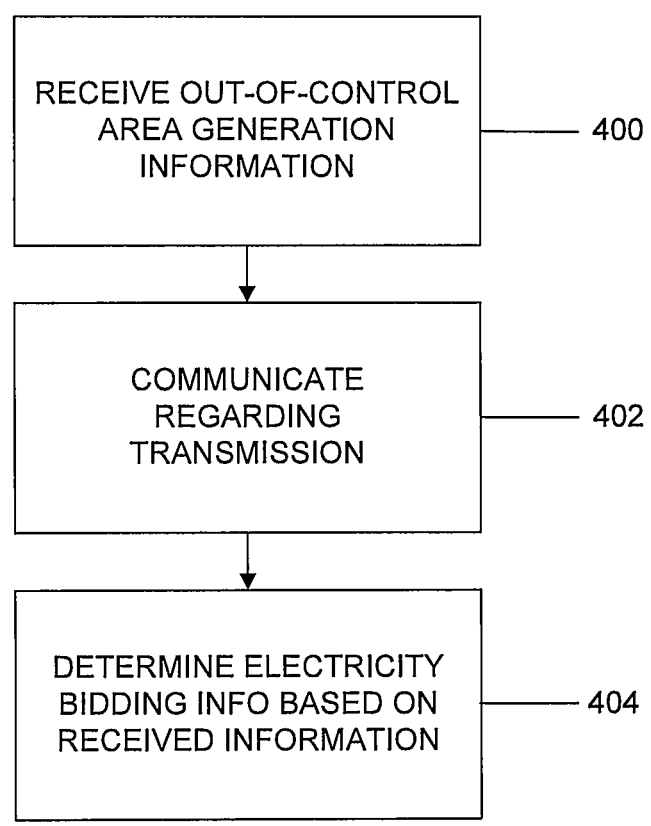
FIG. 4 shows an example of a method for automated electricity delivery management in accordance with an embodiment of the invention.

FIG. 4 shows an example of a method for automated electricity delivery management in accordance with an embodiment of the invention. A method for automated electricity delivery management may include receiving out-of-control area generation information 400, communicating regarding transmission of the generated electricity 402, and determining an electricity distribution based on the received information 404.

An automated electricity delivery management may also include receiving information from an entity outside a control area and from an entity within the control area. The method may include determining in real-time using a processor, based on the information received from the entity outside the control area and the information received from the entity within the control area, the distribution of electricity from the entity outside the control area to the entity within the control area.

The method may include receiving out-of-control area information. Information may be received from out-of-control area entities. Such information may include information from out-of-control area generator owners, transmission owners, and/or any other entities described elsewhere herein. The method may also include receiving information from within the control area; information may be received from entities within the control area. For example, information from generator owners from within the control area and/or transmission owners within the control area may also be provided. Information from grid operators within the control area may also be provided. Such information may be provided through a network device and/or sensor. Such information may be received at a web server. In some embodiments, the information may be received at the server continuously in real-time.

Communications regarding transmissions may include collecting information about transmission availability, capacity and/or pricing, and/or requesting transmission reservations. Communications regarding transmissions may include information received from transmission owners, and/or information provided to transmission owners. Such transmission availability may depend on selected generators. For example, if a generator within a control area is selected to provide electricity, a transmission within the control area may be preferable. In some instances, if a generator from outside the control area is selected to provide electricity, the infrastructure to provide such electricity may also be at least partially outside the control area. Such communications may be provided by a network device and/or sensor. Such information may be received at a web server and/or provided from a web server. In some embodiments, the information may be received at the server or provided by the server continuously in real-time.

The method may also include determining electricity bidding and/or distribution based on the received information (e.g., need, availability, capacity, path, and/or pricing). An electricity bid may include an offer for one or more generator or transmission owner to provide a predetermined amount of electricity for a predetermined price. An electricity bid may include an offer to purchase a predetermined amount of electricity for a predetermined price. Such bids may be generated rapidly in real-time, or at any length of time before anticipated need.

The determination may be automatically made using a processor. The determination may be made electronically without requiring human intervention. The determination may include selecting one or more generator and/or transmission infrastructure to utilize to provide electricity to one or more requesting grid operator. The determination may include selecting one or more generator that is outside the control area, within the control area, or any combination thereof. Similarly, the determination may include selecting one or more transmission infrastructure that is outside the control area, within the control area, or any combination thereof. The determination may further include determining how electricity is distributed to one or multiple grid operators within the control area. The determination may include selecting one or more entities that are to be involved in the electricity distribution. The electricity distribution may include the entire process or any portion of the process from electricity generation to electricity distributor and/or electricity consumer.

Any of the steps of the methods described herein may be provided in a sequence described or in any other order. The information may be gathered and/or transmitted prior to, concurrently with, and/or subsequent to performing the determination of an electricity bid and/or distribution. Additional steps may be provided. Any of the steps provided may be optional and need not be performed in. One or more steps may be substituted by other or more similar steps or other steps.

The systems and methods for automated electricity distribution management may include one or more characteristic, component, feature, and/or steps of various electricity distribution management systems known or later developed in the art. See, e.g., PCT Application Serial No. PCT/US2011/056224 filed Oct. 13, 2011, which is hereby incorporated by reference in its entirety.

It should be understood from the foregoing that, while particular implementations have been illustrated and described, various modifications can be made thereto and are contemplated herein. It is also not intended that the invention be limited by the specific examples provided within the specification. While the invention has been described with reference to the aforementioned specification, the descriptions and illustrations of the preferable embodiments herein are not meant to be construed in a limiting sense. Furthermore, it shall be understood that all aspects of the invention are not limited to the specific depictions, configurations or relative proportions set forth herein which depend upon a variety of conditions and variables. Various modifications in form and detail of the embodiments of the invention will be apparent to a person skilled in the art. It is therefore contemplated that the invention shall also cover any such modifications, variations and equivalents.

What is claimed is:

1. An automated electricity delivery management system comprising:
    one or more server for receiving information from an entity outside a control area and from an entity within the control area; and
    a processor for (1) determining in real-time, based on the information received from the entity outside the control area and the information received from the entity within the control area, the distribution of electricity from the entity outside the control area to the entity within the control area, and (2) generating a signal that effects transmission of electricity from one or more generators of the entity outside the control area to the entity within the control area.

2. The system of claim 1 wherein the entity outside the control area is at least one of the following: generator owner, or transmission owner.

3. The system of claim 1 wherein the entity within the control area is a grid operator.

4. The system of claim 1 wherein the information is continuously received at the one or more server in real-time.

5. The system of claim 1 further comprising a generator outside the control area configured to generate electricity and a transmission infrastructure configured to convey the generated electricity to one or more distributor within the control area.

6. The system of claim 1 further comprising a bid management engine in communication with the processor that provides bids and/or pricing information to the processor.

7. The system of claim 1 further comprising a transmission reservation engine in communication with the processor that provides transmission availability, capacity and/or pricing information to the processor.

8. The system of claim 1 further comprising a real-time analytics/forecast engine that receives information from the processor and performs one or more calculation that connects at least one entity that needs electricity with at least one entity that can provide electricity.

9. The system of claim 8 further comprising a data visualization engine that receives information from the real-time analytics/forecast engine and that generates one or more form of data in a visual form.

10. A method for automated electricity delivery management comprising:

receiving information about real-time out-of-control area power generation from an out-of-control area power generator;

generating a signal that effects communication of at least one transmission reservation that effects delivery of electricity from the out-of-control area power generator;

communicating the at least one transmission reservation to a transmission owner that delivers the electricity generated by the out-of-control area power generator; and determining, using a processor, electricity import bidding information based on the received real-time out-of-control area power generation information.

11. The method of claim 10 the out-of-control area power generation information is provided through a sensor.

12. The method of claim 10 wherein the electricity import bidding information is determined based on one or more of the following: need, availability, capacity, path, and pricing.

13. The method of claim 10 further comprising determining distribution of electricity to one or more multiple grid operators within the control area.

14. The method of claim 10 further comprising receiving information from an entity within the control area and using said information from said entity within the control area for determining the electricity importing bidding information.

15. The method of claim 14 wherein the entity within the control area is a grid operator.

16. The method of claim 10 further comprising selecting one or more generator and transmission infrastructure that provides electricity.

17. The method of claim 16 wherein said selection includes determining whether the one or more generator and transmission infrastructure are within the control area or outside the control area.

18. The method of claim 10 further comprising providing said electricity import bidding information to a data visualization engine configured to generates one or more form of data in a visual form.

19. The method of claim 18 further comprising outputting the one or more form of data in the visual form on a customer dashboard shown on a display interface of a device.

20. The method of claim 18 wherein the form of data in the visual form includes trending information.

* * * * *